(12) United States Patent
Bansal et al.

(10) Patent No.: US 9,787,429 B2
(45) Date of Patent: Oct. 10, 2017

(54) FORWARD ERROR CORRECTION (FEC) DATA TRANSMISSION SYSTEM

(71) Applicant: BROADCOM CORPORATION, Irvine, CA (US)

(72) Inventors: Ankit Sajjan Kumar Bansal, San Jose, CA (US); Eric Allen Baden, Saratoga, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 23 days.

(21) Appl. No.: 14/616,616

(22) Filed: Feb. 6, 2015

(65) Prior Publication Data

US 2015/0229440 A1    Aug. 13, 2015

Related U.S. Application Data

(60) Provisional application No. 61/937,413, filed on Feb. 7, 2014.

(51) Int. Cl.
*H04L 1/00* (2006.01)
*H04L 29/06* (2006.01)
(Continued)

(52) U.S. Cl.
CPC ...... *H04L 1/0041* (2013.01); *H03M 13/1515* (2013.01); *H04L 1/0045* (2013.01);
(Continued)

(58) Field of Classification Search
CPC ....... H04L 1/0041; H04L 65/607; H04L 1/00; H04L 1/0042; H04L 43/0823;
(Continued)

(56) References Cited

U.S. PATENT DOCUMENTS

| | | | |
|---|---|---|---|
| 8,949,699 B1 * | 2/2015 | Gustlin | H03M 13/1515 714/784 |
| 9,059,850 B2 * | 6/2015 | Wang | H04L 25/14 714/712 |

(Continued)

OTHER PUBLICATIONS

Draft Standard for Ethernet Amendment X: Physical Layer Specifications and Management Parameters for 100 Gb/s Operation Over Backplanes and Copper Cables; IEEE P802.3bj™/D3.0, Nov. 18, 2013 (Amendment of IEEE Std 802.3™—2012).*

(Continued)

*Primary Examiner* — Cynthia Britt
(74) *Attorney, Agent, or Firm* — McDermott Will & Emery LLP (57) ABSTRACT

A device implementing a forward error correction data transmission system may include at least one processor circuit. The at least one processor circuit may be configured to perform line encoding on a data stream received from a media access control (MAC) module, and periodically insert alignment markers after every number of blocks of the data stream, where the alignment markers are determined based at least in part on a data rate of an associated port. The at least one processor circuit may be further configured to transcode the data stream, where each alignment marker remains contiguous in the transcoded data stream. The at least one processor circuit may be further configured to add parity information to the transcoded data stream. The at least one processor circuit may be further configured to transmit the transcoded data stream over at least one physical lane of the associated port.

20 Claims, 10 Drawing Sheets (51) Int. Cl.
*H04N 21/00* (2011.01)
*H03M 13/15* (2006.01)

(52) U.S. Cl.
CPC .......... *H04L 1/0057* (2013.01); *H04L 65/607* (2013.01); *H04N 21/00* (2013.01)

(58) Field of Classification Search
CPC . H04L 43/0847; H04L 1/0057; H04L 1/0045; H04L 29/06; G06F 11/10; H03M 13/152; H03M 13/155; H03M 13/251; H03M 13/00; H03M 13/1515; H04N 21/00
USPC .................................................. 714/776, 800
See application file for complete search history.

(56) References Cited

U.S. PATENT DOCUMENTS

| | | | |
|---|---|---|---|
| 9,235,540 B1* | 1/2016 | Langhammer | G06F 13/36 |
| 2008/0170531 A1* | 7/2008 | Petry | H04L 65/601 |
| | | | 370/312 |
| 2010/0208753 A1* | 8/2010 | Brown | H04L 29/06 |
| | | | 370/476 |
| 2013/0208771 A1* | 8/2013 | Wang | H04L 25/02 |
| | | | 375/219 |
| 2014/0376566 A1 | 12/2014 | Mehta et al. | |

OTHER PUBLICATIONS

Cideciyan, Roy; Gustlin, Mark; Peng Li, Mike; Wang, John and Wang, Zhongfeng, "Next Generation Backplane and Copper Cable Challenges", IEEE Communications Magazine vol. 51, No. 12; Dec. 2013; pp. 130-136.*
D'Ambrosia, et al., "802.3bj FEC Overview and Status," slide presentation, Sep. 2012, 12 pages.
Gustlin, et al., "FEC Architectural Considerations," slide presentation, Nov. 2011, 15 pages.
Gustlin, "40 and 100 Gigabit Ethernet PCS and PMA Overview," slide presentation, Oct. 2010, 16 pages, IEEE ComSocSCV, Santa Clara.
Healey, "32GCF forward error correction (FEC) proposal," slide presentation, LSI Storage Networking Accelerated, Dec. 2012, 17 pages.
Ixia, "An Overview of Next-Generation 100 and 40 Gigabit Ethernet Technologies," white paper, Sep. 2009, 12 pages.
Ixia, "Enabling 100 Gigabit Ethernet Implementing PCS Lanes" white paper, Jan. 2014, 12 pages.
Matharu, "100G Dual Gearbox: Improving Port Densit on Line Cards in Core Network Equipment," white paper: Virtex-7 HT FPGAs, Xilinx Inc, Mar. 2012, 10 pages.

* cited by examiner

FIG. 10

FORWARD ERROR CORRECTION (FEC) DATA TRANSMISSION SYSTEM

CROSS-REFERENCE TO RELATED APPLICATIONS

The present application claims the benefit of U.S. Provisional Patent Application Ser. No. 61/937,413, entitled "Data Transmission System," filed on Feb. 7, 2014, which is hereby incorporated by reference in its entirety for all purposes.

TECHNICAL FIELD

The present description relates generally to a data transmission system, including a system for transmitting data over single physical lane or dual physical lane ports, with forward error correction (FEC) coding.

BACKGROUND

A networking port may be configured to transfer data over four physical lanes. For example a 100 Gigabit (100 G) Ethernet port may transfer approximately 25 gigabits of data per second over each of four physical lanes. The data may be encoded using forward error correction (FEC), such as by using Reed Solomon (RS) FEC. The 100 G port may utilize a physical coding sublayer (PCS) encoder/decoder defined by Institute of Electrical and Electronics Engineers (IEEE) clause 82 (CL82), and an RS FEC encoder/decoder defined by IEEE clause 91 (CL91).

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

In the subject forward error correction (FEC) data transmission system, forward error correction is provided for a networking port that operates over a single physical lane, such as at 25 gigabits/second (25 G), or a port that operates over two physical lanes, such as two 25 G physical lanes, or 50 G for the port. The subject system provides for a reduction in resources, e.g. chip space, power, etc., by merging physical coding sublayer (PCS) functions and FEC functions. The subject system also provides interoperability with components utilized for ports that operate over four physical lanes at 25 G per lane or 100 G per port, such as an IEEE CL82 PCS encoder/decoder, and an IEEE CL91 RS FEC encoder/decoder. For example, the subject system can utilize the CL82 40 G alignment markers for a single physical lane 25 G port and/or for a dual physical lane 50 G port, thereby providing interoperability with ports that utilize the entire set of CL82 40 G alignment markers.

Figure 1:
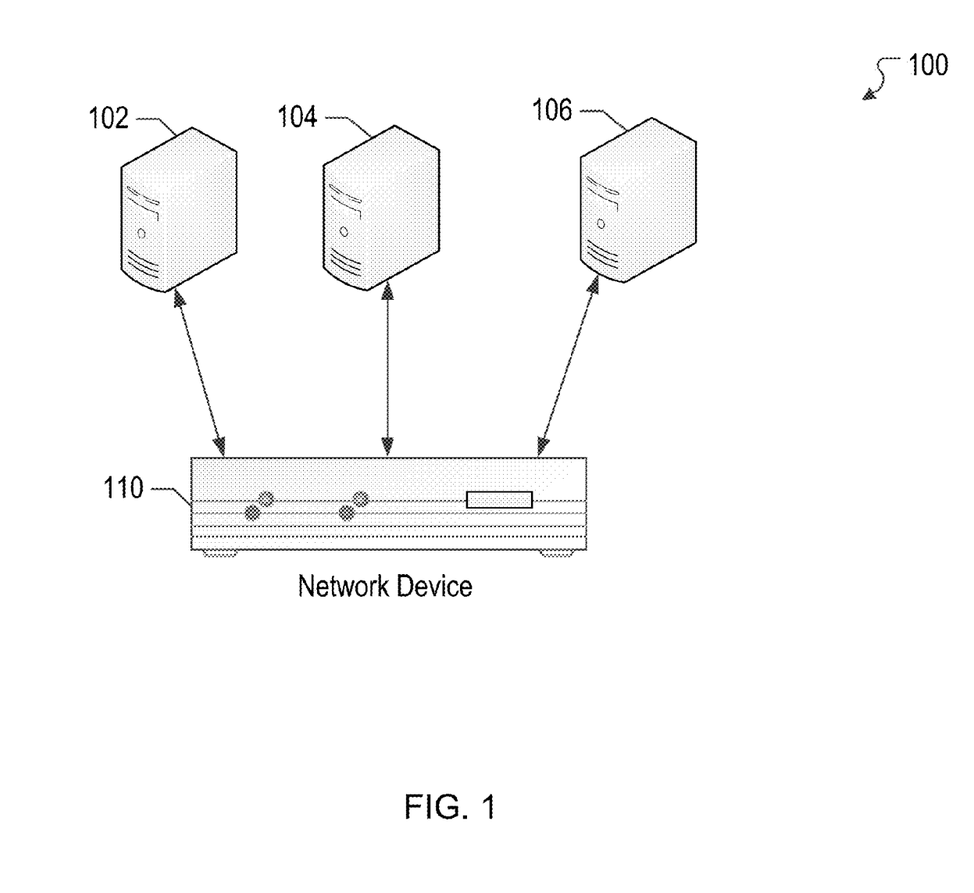
FIG. 1 illustrates an example network environment in which a forward error correction (FEC) data transmission system may be implemented in accordance with one or more implementations.

FIG. 1 illustrates an example network environment 100 in which a FEC data transmission system may be implemented in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example network environment 100 includes various electronic devices 102, 104, 106, such as one or more servers, computers, data storage devices, network components, network devices, etc. In one or more implementations, the network environment 100 includes a set of servers, a server bank, a storage area network, and/or a vast network of interconnected computers or network devices. In one or more implementations, the network environment 100 includes one or more other devices, such as, for example, one or more mobile devices, tablet devices, set-top box (STB) devices, storage devices, desktop computers, routers, switches, bridges, or any other machine or device.

One or more network devices, such as the network device 110, may be implemented to facilitate communication between the one or more electronic devices 102, 104, 106 of the network environment 100. The electronic devices 102, 104, 106 of the network environment 100, are connected or otherwise in communication with each other, through or using the network device 110. For example, the electronic devices 102, 104, 106 may each be coupled to one or more physical ports of the network device 110 by a network transmission line, such as an Ethernet transmission line, a coaxial transmission line, an optical transmission line, fibre channel, or generally any transmission line. In one or more implementations, one or more of the electronic devices 102, 104, 106 is wirelessly coupled to the network device 110. The network device 110 and/or one or more of the electronic devices 102, 104, 106 may be and/or may include all or part of the electronic system discussed below with respect to FIG. 10.

The electronic devices 102, 104, 106, and the network device 110, each include one or more ports for transmitting/receiving data over one or more physical lanes. The ports may include, for example, one or more single physical lane 25 G ports, one or more dual physical lane 50 G ports, and/or a 100 G port that operates on four physical lanes. The electronic devices 102, 104, 106, and/or the network device 110 implement forward error correction (FEC), such as Reed-Solomon (RS) FEC for each of the ports.

In order to facilitate interoperability between the components that are utilized for the different ports, the electronic devices 102, 104, 106, and/or the network device 110 re-use a set of alignment markers utilized for a 40 G port, such as CL82 40 G alignment markers (AM0, AM1, AM2, and AM3), for the single physical lane 25 G and the dual physical lane 50 G ports. Thus, the alignment markers that are utilized varies depending upon the data rate of the associated port, e.g. 100 G or 25 G/50 G. The transcoding utilized for the 100 G port is also modified for the single physical lane 25 G port and the dual physical lane 50 G port, e.g. to ensure that the alignment markers appear as contiguous data on the transmit wire. Furthermore, the PCS and FEC functions of the 100 G port may be merged for the single physical lane 25 G port and/or the dual physical lane 50 G port, e.g. for reduction in chip space, power consumption, etc.

An example network device 110 that utilizes a merged transmit (Tx) PCS-FEC component for a dual physical lane 50 G port is discussed further below with respect to FIGS. 2 and 6, and the complementary merged receive (Rx) PCS-FEC component for the dual physical lane 50 G port is discussed further below with respect to FIGS. 3 and 7. An example network device 110 that utilizes a merged Tx PCS-FEC component for a single physical lane 25 G port is discussed further below with respect to FIGS. 4 and 8, and the complementary merged Rx PCS-FEC component for the single physical lane 25 G port is discussed further below with respect to FIGS. 5 and 9.

Figure 2:
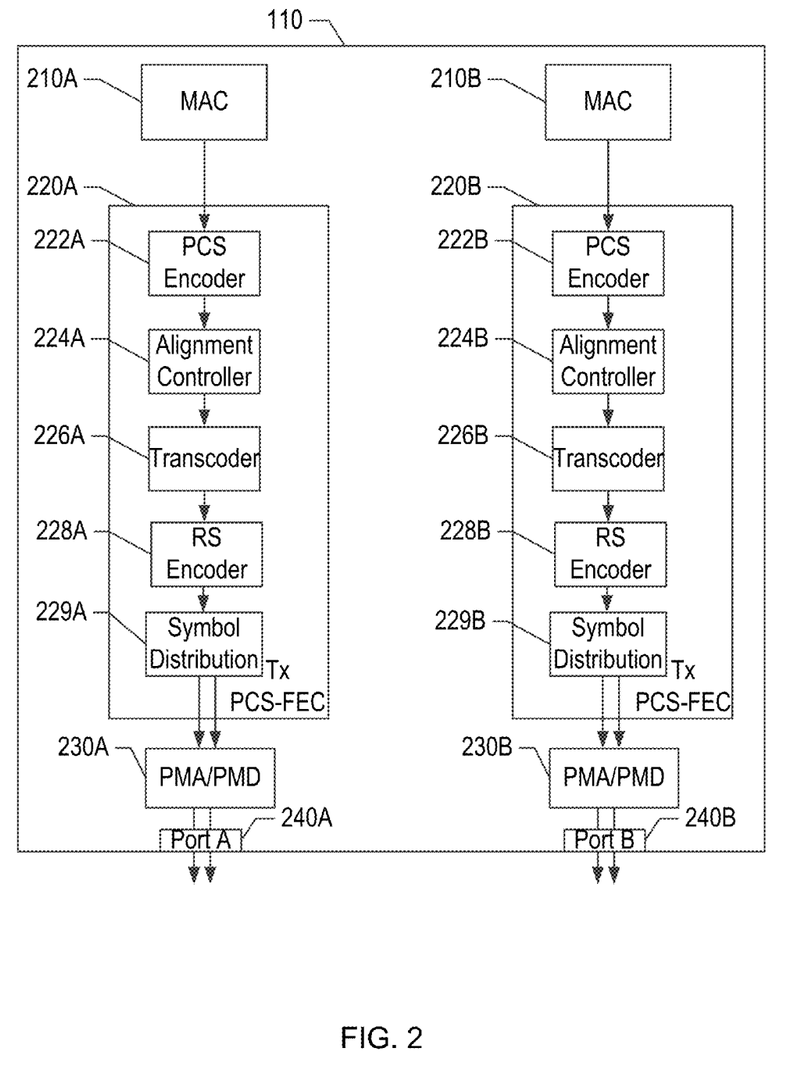
FIG. 2 illustrates an example transmit portion of an example network device that includes a dual physical lane 50 gigabit per second (50 G) port in accordance with one or more implementations.

FIG. 2 illustrates an example transmit portion of an example network device 110 that includes a dual physical lane 50 G port in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. Furthermore, one or more of the illustrated components may be merged/combined into a single component and/or one or more of the illustrated components may be split into multiple separate components.

The example network device 110 includes one or more media access control (MAC) modules 210A-B, one or more transmit (Tx) PCS-FEC components 220A-B, one or more physical medium attachment/physical medium dependent (PMA/PMD) modules 230A-B, and one or more dual physical lane 50 G ports 240A-B. For explanatory purposes, two dual physical lane 50 G ports 240A-B are illustrated; however, the subject system can be implemented on either one of the dual physical lane 50 G ports 240A-B individually. Two FEC lanes are supported for each of the ports 240A-B (one per physical lane). The one or more Tx PCS-FEC components 220A-B include PCS encoders 222A-B, alignment controllers 224A-B, transcoders 226A-B, Reed-Solomon (RS) encoders 228A-B, and symbol distribution modules 229A-B. In one or more implementations, the example network device 110 utilizes a 40 gigabit media independent interface (XLGMII).

The PCS encoders 222A-B perform one or more PCS functions on data received from the MAC modules 210A-B, such as 64 b/66 b line encoding to convert from the natural data path width of the design to that of the transcoders 226A-B, scrambling, etc. The PCS encoders 222A-B may be interoperable with and/or may utilize one or more components of, for example, IEEE CL49 and/or IEEE CL82 PCS encoders. The functions of the PCS encoders 222A-B may be logical lane based such that the final output can be forwarded to any physical interface on the network device 110. The alignment controllers 224A-B insert the CL82 40 G alignment marker columns ("alignment markers") used for the 40 G port after every number of blocks in the line encoded data streams, such as every ((16384*5)−4) 66-bit blocks. The alignment markers may each include bit interleaved parity (BIP) values that are calculated per IEEE CL82. The CL82 40 G alignment markers may include AM0, AM1, AM2, and AM3. The alignment controllers 224A-B also delete an equivalent number of bytes, such as bytes of IDLE columns, to account for the bandwidth addition of the alignment markers. In one or more implementations, an IDLE column is an eight byte entity defined by IEEE for CL82.

The transcoders 226A-B transcode, e.g. compress, the data stream in a manner that ensures that the four inserted alignment markers appear as contiguous data on the transmit wire. For example, the transcoders 226A-B compress the four alignment markers by removing the sync header (SH) bits and adding 1 bit. Then the transcoders 226A-B arrange the alignment markers into two sets, one per FEC lane. The first set contains AM0 concatenated with AM2 and the second set contains AM0 (as defined by IEEE for the CL91 case) concatenated with AM3. The transcoders 226A-B then merge the two FEC lane sets of data, as is discussed further below with respect to FIG. 6. The RS encoders 228A-B perform forward error correction encoding on the transcoded data stream, such as by adding parity information to the data stream. The RS encoders 228A-B may be interoperable with and/or may utilize one or more components of, for example, IEEE CL91 RS encoders. The symbol distribution modules 229A-B perform symbol distribution, on 10-bit symbol boundaries, to the two physical lanes assigned to the associated ports 240A-B. The PMA/PMD modules 230A-B provide the distributed symbols for transmission over the associated ports 240A-B.

In one or more implementations, one or more of the MAC modules 210A-B, the Tx PCS-FEC components 220A-B, the PCS encoders 222A-B, the alignment controllers 224A-B, the transcoders 226A-B, the RS encoders 228A-B, the symbol distribution modules 229A-B, and/or the PMA/PMD modules 230A-B may be implemented in software, and/or may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or may be implemented in a combination of both. Additional features and functions of these modules according to various aspects of the subject technology are further described in the present disclosure.

Figure 3:
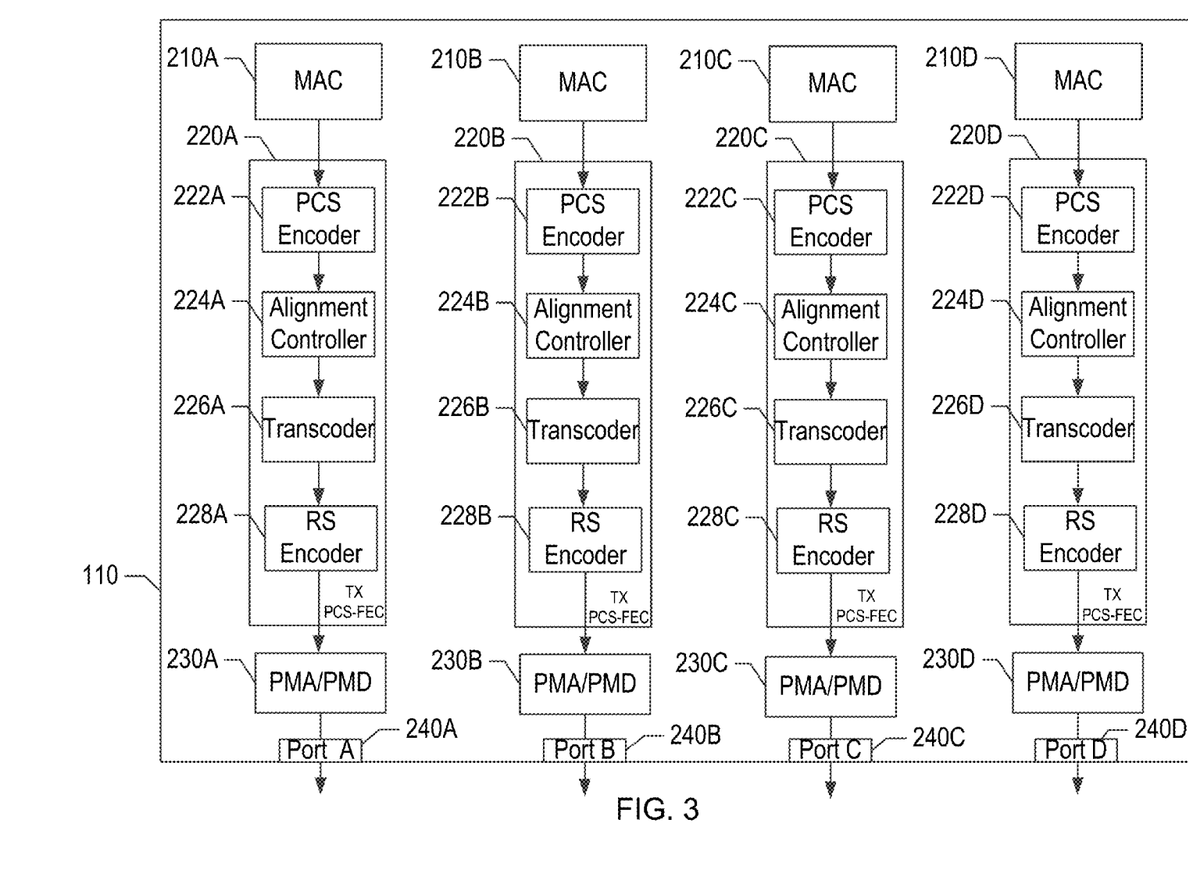
FIG. 3 illustrates an example transmit portion of an example network device that includes a single physical lane 25 gigabit per second (25 G) port in accordance with one or more implementations.

FIG. 3 illustrates an example transmit portion of an example network device 110 that includes a single physical lane 25 G port in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. Furthermore, one or more of the illustrated components may be merged/combined into a single component and/or one or more of the illustrated components may be split into multiple separate components.

The example network device 110 includes one or more MAC modules 210A-D, one or more transmit (Tx) PCS-FEC components 220A-D, one or more PMA/PMD modules 230A-B, and one or more single physical lane 25 G ports 240A-D. For explanatory purposes, four single physical lane 25 G ports 240A-D are illustrated; however, the subject system can be implemented on one or more of the single physical lane 25 G ports 240A-D individually. The one or more Tx PCS-FEC components 220A-D include PCS encoders 222A-D, alignment controllers 224A-D, transcoders 226A-D, and RS encoders 228A-D. In one or more implementations, the example network device 110 utilizes an XGMII type interface.

The PCS encoders 222A-D perform one or more PCS functions on data received from the MAC modules 210A-D, such as 64 b/66 b line encoding to convert from the natural data path width of the design to that of the transcoders 226A-D, scrambling, etc. The PCS encoders 222A-D may be interoperable with and/or may include one or more components of, for example, IEEE CL49 and/or IEEE CL82 PCS encoders. The functions of the PCS encoders 222A-D may be logical lane based such that the final output can be forwarded to any physical interface on the network device 110. The alignment controllers 224A-D insert the CL82 40 G alignment marker columns used for the 40 G port after every number of blocks in the line encoded data streams, such as every ((16384*5)−4) 66-bit blocks. The alignment marker BIP values are not calculated and are set to a fixed value. In one or more implementations, the CL82 40 G alignment markers that are used include AM0, AM1, AM2, and AM3. The alignment controllers 224A-D also delete an equivalent number of bytes, such as bytes of half-IDLE columns, to account for the bandwidth addition of the alignment markers. In one or more implementations, a half-IDLE column is four bytes of an 8 byte IEEE defined column for CL82.

The transcoders 226A-D transcode, e.g. compress, the data stream in a manner that ensures that the four inserted alignment markers appear as contiguous data on the transmit wire. For example, the transcoders 226A-D compress the four alignment markers by removing the sync header (SH) bits, and adding one bit of 1'b1 at the end. Thus, the four—66-bit alignment markers are compressed to four—64-bit datum, plus one extra bit, for a total of 257 bits, which is the IEEE transcoder compression rate requirement. The operations of the transcoders 226A-D for the single physical lane 25 G ports 240A-D are discussed further below with respect to FIG. 8. The RS encoders 228A-D perform forward error correction encoding on the transcoded data stream, such as by adding parity information to the data stream. The RS encoders 228A-D may be interoperable with and/or may include one or more components of, for example, IEEE CL91 RS encoders. The output of the RS encoders 228A-D are contiguously sent out over the physical lanes of the associated ports 240A-D via the respective PMA/PMD modules 230A-D.

In one or more implementations, one or more of the MAC modules 210A-D, the Tx PCS-FEC components 220A-D, the PCS encoders 222A-D, the alignment controllers 224A-D, the transcoders 226A-D, the RS encoders 228A-D, the symbol distribution modules 229A-D, and/or the PMA/PMD modules 230A-D may be implemented in software, and/or may be implemented in hardware (e.g., an ASIC, a FPGA, a PLD, a controller, a state machine, gated logic, discrete hardware components, or any other suitable devices) and/or may be implemented in a combination of both. Additional features and functions of these modules according to various aspects of the subject technology are further described in the present disclosure.

Figure 4:
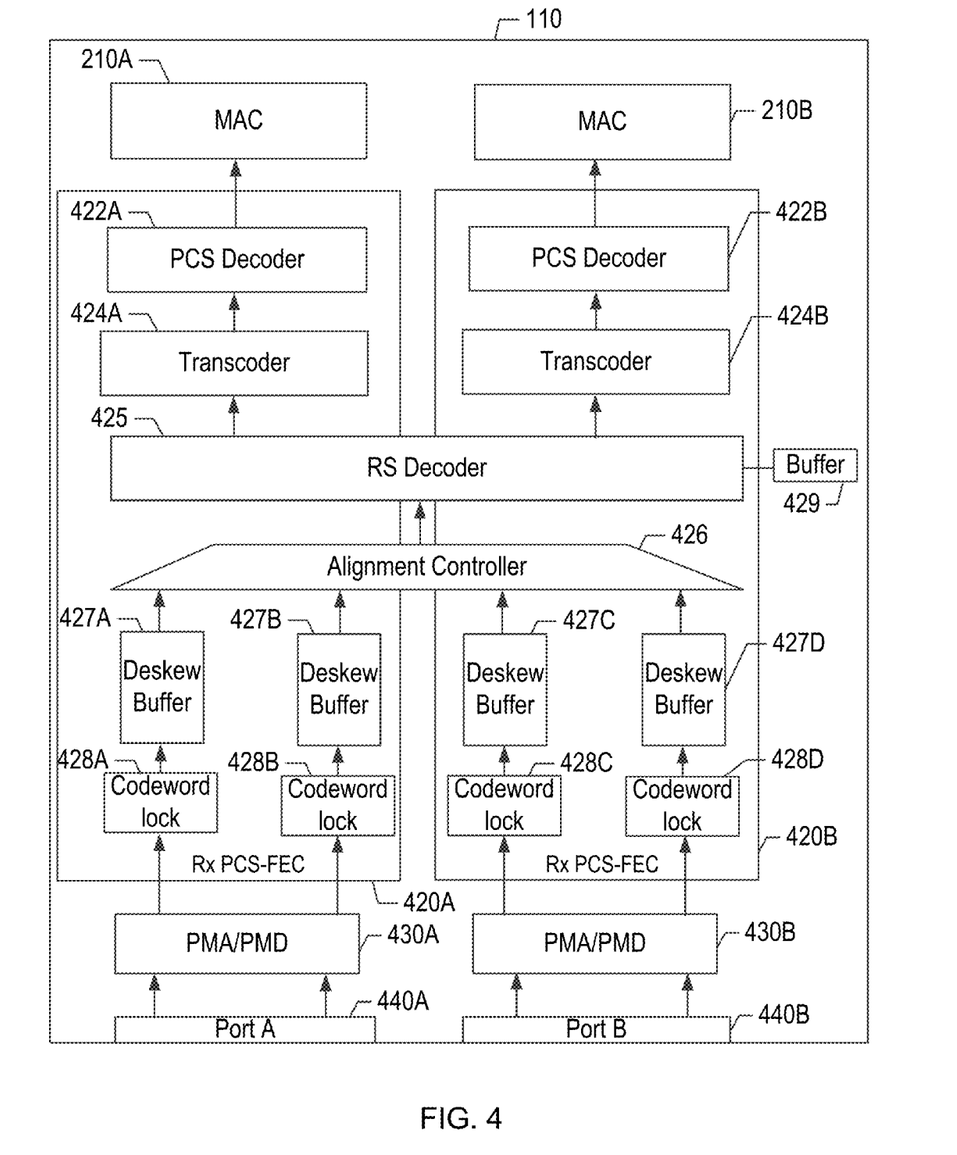
FIG. 4 illustrates an example receive portion of an example network device that includes a dual physical lane 50 G port in accordance with one or more implementations.

FIG. 4 illustrates an example receive portion of an example network device 110 that includes a dual physical lane 50 G port in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. Furthermore, one or more of the illustrated components may be merged/combined into a single component and/or one or more of the illustrated components may be split into multiple separate components.

The example network device 110 includes one or more MAC modules 210A-B, one or more receive (Rx) PCS-FEC components 420A-B, one or more PMA/PMD modules 430A-B, and one or more dual physical lane 50 G ports 440A-B. For explanatory purposes, two dual physical lane 50 G ports 440A-B are illustrated; however, the subject system can operate on either one of the dual physical lane 50 G ports 440A-B individually. Two FEC lanes are supported for each of the ports 440A-B (one per physical lane). The one or more Rx PCS-FEC components 420A-B include PCS decoders 422A-B, transcoders 424A-B, an RS decoder 425, an alignment controller 426, one or more deskew buffers 427A-D, and one or more codeword lock modules 428A-D. In one or more implementations, the example network device 110 utilizes an XLGMII type interface.

Data streams are received over the dual physical lanes of each of the ports 440A-B and provided to the Rx PCS-FEC components 420A-B by the associated PMA/PMD modules 430A-B. The codeword lock modules 428A-D align the codewords of each of the data streams received over each of the physical lanes. In one or more implementations, the codeword lock modules 428A-D only use the single AMs (AM2 or AM3) after AM0 to determine the FEC lane number for each of the ports 440A-B. Each of the deskew buffers 427A-D operates as both a deskew buffer and a codeword (CW) buffer.

The alignment controller 426 re-merges the output of the deskew buffers 427A-D from any two physical lane pairs, e.g. deskew buffers 427A-B and/or deskew buffers 427C-D, on a symbol basis per physical lane. The alignment controller 426 utilizes TDM to send an entire codeword from each port to the RS decoder 425 on a port-by-port basis. The RS decoder 425 may be interoperable with a CL91 RS decoder, and therefore may be capable of handling a single 100 G port, or two 50 G ports in a TDM fashion. The RS decoder 425 utilizes the buffer 429 to store state information, such as statistics, associated with the decoding of each of the ports 440A-B. Separate controls are sent to the RS decoder 425 on a per port basis based on which of the ports 440A-B the current codeword is associated with. The status output from the RS decoder 425 is copied to per port equivalent status to maintain the per port decoder status. The transcoders 424A-B perform a transcoding of the output of the RS decoder 425 that is the reverse of the transcoding performed by the transcoders 226A-B of FIG. 2. The transcoded output is then provided to the PCS decoders 422A-B.

The PCS decoders 422A-B may be interoperable with and/or may include one or more components of, for example, IEEE CL49 and/or IEEE CL82 PCS encoders. The PCS decoders 422A-B perform one or more PCS functions on the data stream including line decoding, such as 66 b/64 b line decoding, and transmit the decoded data stream to the MAC modules 210A-B. The operations of the Rx PCS-FEC components 420A-B for the dual physical lane 50 G ports 440A-B are discussed further below with respect to FIG. 7.

In one or more implementations, one or more of the MAC modules 210A-B, the Rx PCS-FEC components 420A-B, the PCS decoders 422A-B, the transcoders 424A-B, the RS decoder 425, the alignment controller 426, the deskew buffers 427A-D, the codeword lock modules 428A-D, and/or the PMA/PMD modules 430A-B may be implemented in software, and/or may be implemented in hardware (e.g., an ASIC, a FPGA, a PLD, a controller, a state machine, gated logic, discrete hardware components, or any other suitable devices) and/or may be implemented in a combination of both. Additional features and functions of these modules according to various aspects of the subject technology are further described in the present disclosure.

Figure 5:
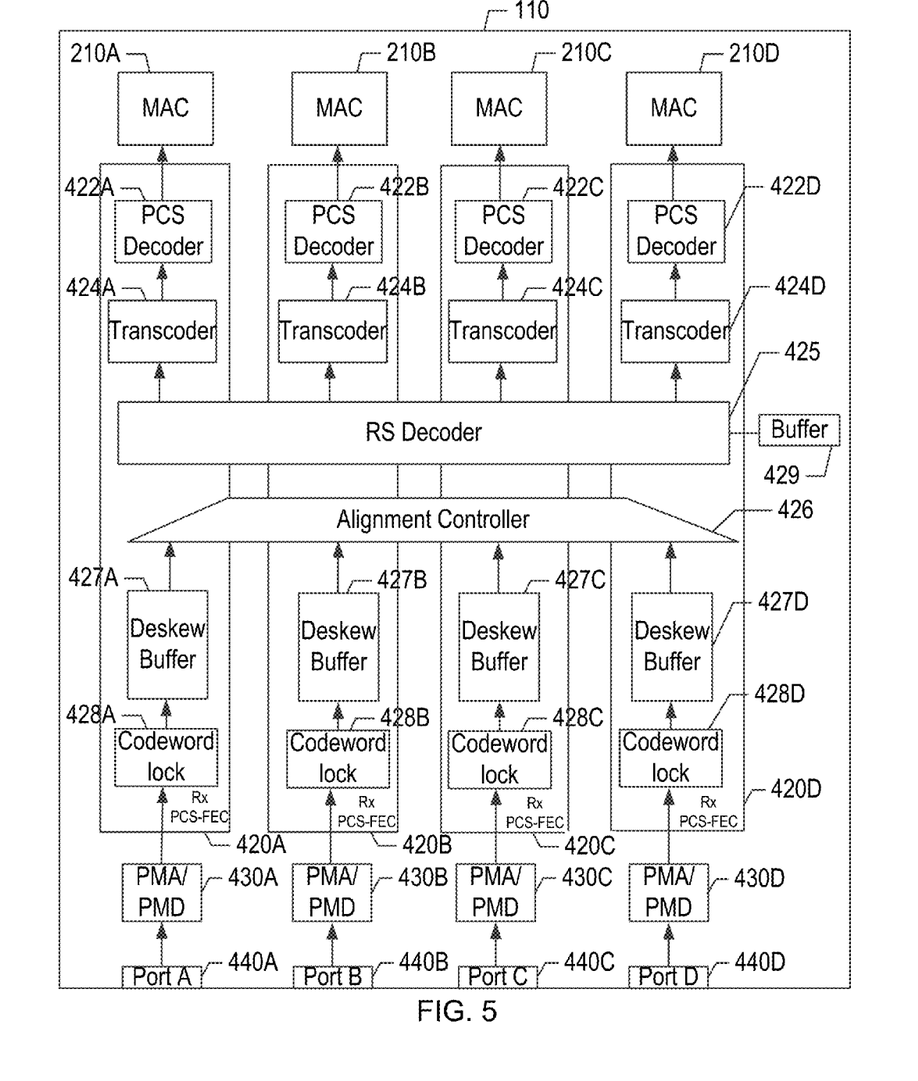
FIG. 5 illustrates an example receive portion of an example network device that includes a single physical lane 25 G port in accordance with one or more implementations.

FIG. 5 illustrates an example receive portion of an example network device 110 that includes a single physical lane 25 G port in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. Furthermore, one or more of the illustrated components may be merged/combined into a single component and/or one or more of the illustrated components may be split into multiple separate components.

The example network device 110 includes one or more MAC modules 210A-D, one or more Rx PCS-FEC components 420A-D, one or more PMA/PMD modules 430A-D, and one or more single physical lane 25 G ports 440A-D. For explanatory purposes, four single physical lane 25 G ports 440A-D are illustrated; however, the subject system can operate on one or more of the single physical lane 25 G ports 440A-D individually. The one or more Rx PCS-FEC components 420A-D include PCS decoders 422A-D, transcoders 424A-D, an RS decoder 425, an alignment controller 426, one or more deskew buffers 427A-D, and one or more codeword lock modules 428A-D. In one or more implementations, the example network device 110 utilizes an XGMII type interface.

Data streams are received over the single physical lanes of each of the ports 440A-D and provided to the Rx PCS-FEC components 420A-D by the associated PMA/PMD modules 430A-D. The codeword lock modules 428A-D align the blocks of each of the data streams received over each of the physical lanes. In one or more implementations, the codeword lock modules 428A-D track only the AM0 alignment marker for each of the ports 440A-D, and ignore the AM1, AM2, and AM3 alignment markers, since there are no FEC lane numbers. Each of the deskew buffers 427A-D operates as both a deskew buffer and a codeword (CW) buffer.

The alignment controller 426 utilizes TDM to send an entire codeword from each of the ports 440A-D to the RS decoder 425 on a port-by-port basis. The RS decoder 425 may be interoperable with a CL91 RS decoder, and therefore may be capable of handling a single 100 G port, or four 25 G ports in a TDM fashion. The RS decoder 425 may utilize the buffer 429 to store state information, such as statistics, associated with the decoding of codewords associated with each of the ports 440A-D. Separate controls are sent to the RS decoder 425 on a per port basis based on which of the ports 440A-D the current codeword is associated with. The status output from the RS decoder 425 is copied to per port equivalent status to maintain the per port decoder status. The transcoders 424A-D perform a transcoding of the output of the RS decoder 425 that is the reverse of the transcoding performed by the transcoders 226A-D of FIG. 3. In one or more implementations, the transcoders 424A-D support IEEE CL49 block types. The transcoded output is then provided to the PCS decoders 422A-D.

The PCS decoders 422A-D may be interoperable with and/or may include one or more components of, for example, IEEE CL49 and/or IEEE CL82 PCS encoders. The PCS decoders 422A-D perform line decoding on the data stream, such as 66 b/64 b line decoding, and transmit the decoded data stream to the MAC modules 210A-D. The operations of the Rx PCS-FEC components 420A-D for the single physical lane 25 G ports 440A-D are discussed further below with respect to FIG. 9.

In one or more implementations, one or more of the MAC modules 210A-D, the Rx PCS-FEC components 420A-D, the PCS decoders 422A-D, the transcoders 424A-D, the RS decoder 425, the alignment controller 426, the deskew buffers 427A-D, the codeword lock modules 428A-D, and/or the PMA/PMD modules 430A-D may be implemented in software, and/or may be implemented in hardware (e.g., an ASIC, a FPGA, a PLD, a controller, a state machine, gated logic, discrete hardware components, or any other suitable devices) and/or may be implemented in a combination of both. Additional features and functions of these modules according to various aspects of the subject technology are further described in the present disclosure.

Figure 6:
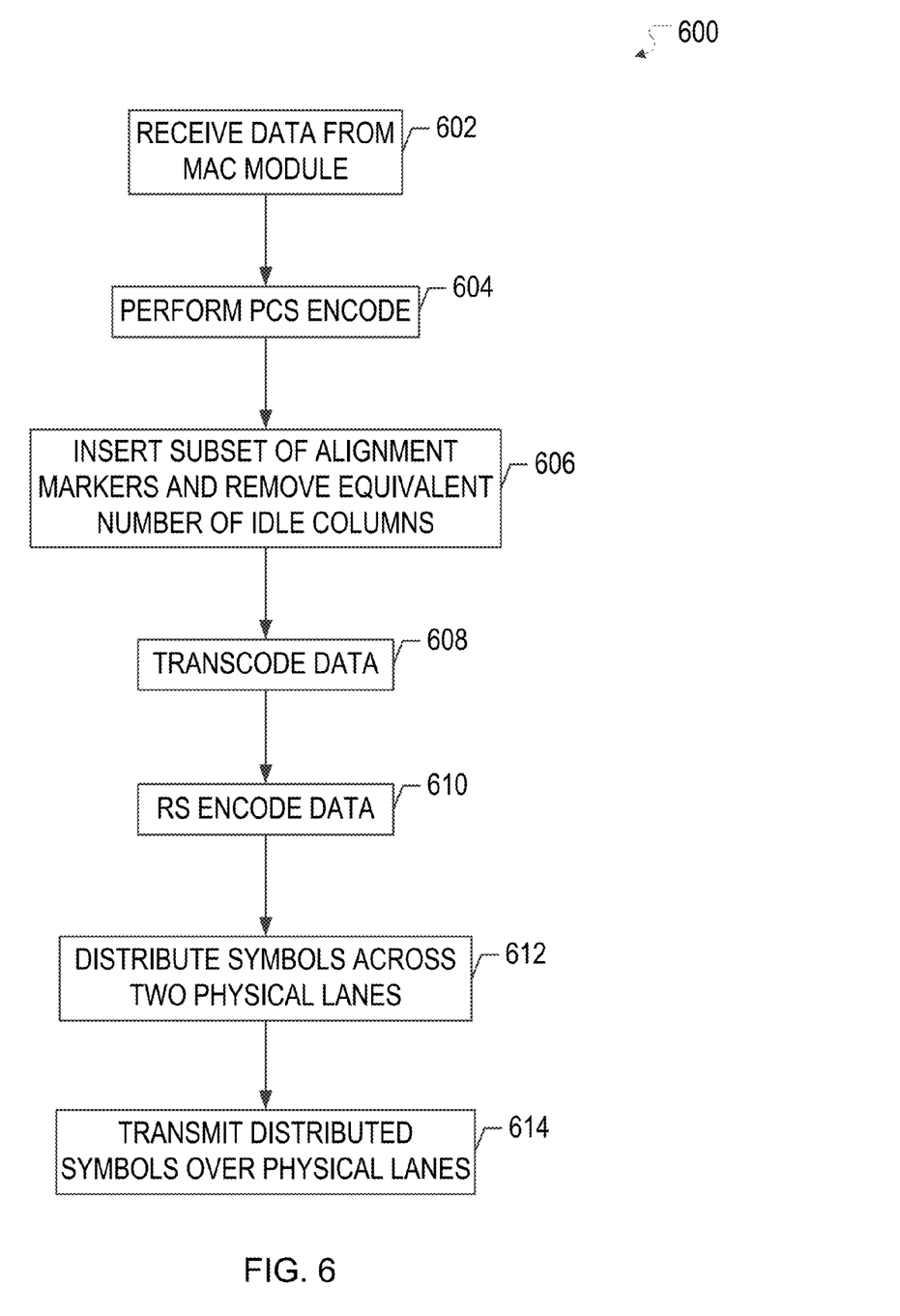
FIG. 6 illustrates a flow diagram of an example process of a transmit portion of a dual physical lane 50 G port of an example network device in accordance with one or more implementations.

FIG. 6 illustrates a flow diagram of an example process 600 of a transmit portion of a dual physical lane 50 G port of an example network device 110 in accordance with one or more implementations. For explanatory purposes, the example process 600 is primarily described herein with reference to the Tx PCS-FEC 220A of the network device 110 of FIG. 2; however, the example process 600 is not limited to the Tx PCS-FEC 220A of the network device 110 of FIG. 2, e.g. the example process 600 may be performed by one or more of the electronic devices 102, 104, 106, and/or the example process 600 may be performed by the Tx PCS-FEC 220B of the network device 110. Further for explanatory purposes, the blocks of the example process 600 are described herein as occurring in serial, or linearly.

However, multiple blocks of the example process 600 may occur in parallel. In addition, the blocks of the example process 600 may be performed a different order than the order shown and/or one or more of the blocks of the example process 600 may not be performed.

The PCS encoder 222A receives a data stream from the MAC module 210A (602). The PCS encoder 222A performs one or more PCS encoding functions on the received data stream, such as 64 b/66 b line encoding (604). The alignment controller 224A inserts the CL82 40 G alignment marker columns, such as AM0, AM1, AM2, AM3, into the data stream every number of blocks, and removes an equivalent number of IDLE columns to account for the bandwidth addition of the alignment markers (606).

The transcoder 226A transcodes (e.g. compresses) the data stream such that two of the alignment markers appear as contiguous data on each of the transmit wires (608). The transcoder 226A compresses the four alignment markers by first removing the sync header bits and then arranges the alignment markers into two sets, one per FEC lane. The first set contains AM0 concatenated with AM2 and the second set contains AM0 (e.g. as defined by IEEE for the CL91 case) concatenated with AM3. The transcoder 226A merges the two FEC lane sets of data by taking 10 bits from the FEC lane 0 data, followed by 10 bits from the FEC lane 1 data, followed by the next 10 bits from the FEC lane 0 data, and so on. After merging 24 sets of 10-bits from each FEC data set, the transcoder 226A constructs the next 10 bits by taking the last 8 bits from the first FEC lane and concatenating the next 2 bits from the second FEC lane. The transcoder 226A constructs the last set of 10 bits by taking the last 6 bits from the second FEC lane followed by one bit of 1'b1, followed by the next 3 bits from the PCS encoder 222A. Thus, the four 66-bit alignment markers are compressed to four 64-bit datum, plus one extra bit, making a total of 257 bits, which is the IEEE transcoder compression rate requirement.

The RS encoder 228A performs RS FEC encoding on the data stream, such as by adding parity information to the data stream (610). The symbol distribution module 229A performs symbol distribution, on 10-bit symbol boundaries, to the two physical lanes assigned to the port 240A (612). The distributed symbols are then transmitted over the physical lanes of the port 240A via the PMD/PMA module 230A (614).

Figure 7:
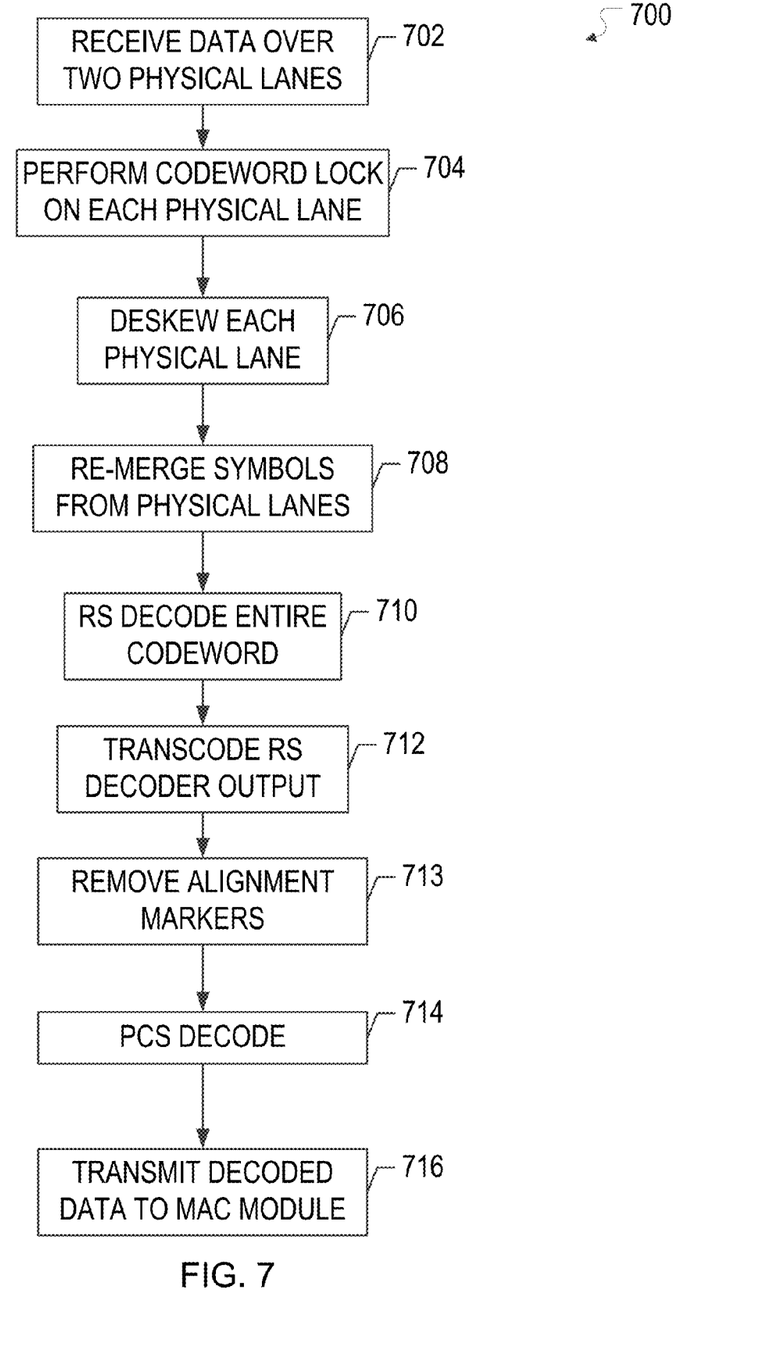
FIG. 7 illustrates a flow diagram of an example process of a receive portion of a dual physical lane 50 G port of an example network device in accordance with one or more implementations.

FIG. 7 illustrates a flow diagram of an example process 700 of a receive portion of a dual physical lane 50 G port of an example network device 110 in accordance with one or more implementations. For explanatory purposes, the example process 700 is primarily described herein with reference to the network device 110 of FIGS. 1 and 4; however, the example process 700 is not limited to the network device 110 of FIGS. 1 and 4, e.g. the example process 700 may be performed by one or more of the electronic devices 102, 104, 106, and/or the example process 700 may be performed by one or more components of the network device 110. Further for explanatory purposes, the blocks of the example process 700 are described herein as occurring in serial, or linearly. However, multiple blocks of the example process 700 may occur in parallel. In addition, the blocks of the example process 700 may be performed a different order than the order shown and/or one or more of the blocks of the example process 700 may not be performed.

The Rx PCS-FEC components 420A-B each receive data over two physical lanes assigned to the respective ports 440A-B via the PMA/PMD modules 430A-B (702). The codeword lock modules 428A-D perform codeword lock on the data streams received over each respective physical lane (704). The codeword lock modules 428A-D may only use the single alignment markers after AM0, e.g. AM2 or AM3, to determine the FEC lane number. The deskew buffers 427A-D deskew each physical lane (706). The alignment controller 426 re-merges the deskew output from any two physical lane pairs, e.g. from the deskew buffers 427A-B or the deskew buffers 427C-D, on a symbol basis per FEC lane (708). The alignment controller 426 provides one entire codeword to the RS decoder 425 at a time in a TDM fashion, e.g. on a port-by-port basis, and the RS decoder 425 decodes the entire codeword (710). The transcoders 424A-B perform reverse transcoding on the output of the RS decoder 425, e.g. the reverse of the transcoding that was performed by the transcoders 226A-B (712). The alignment markers are then removed from the data (713).

The PCS decoders 422A-B perform one or more PCS decoding functions on the data after the alignment markers are removed, such as line decoding (714). The PCS decoders 422A-B transmit the line decoded data to the MAC modules 210A-B (716).

Figure 8:
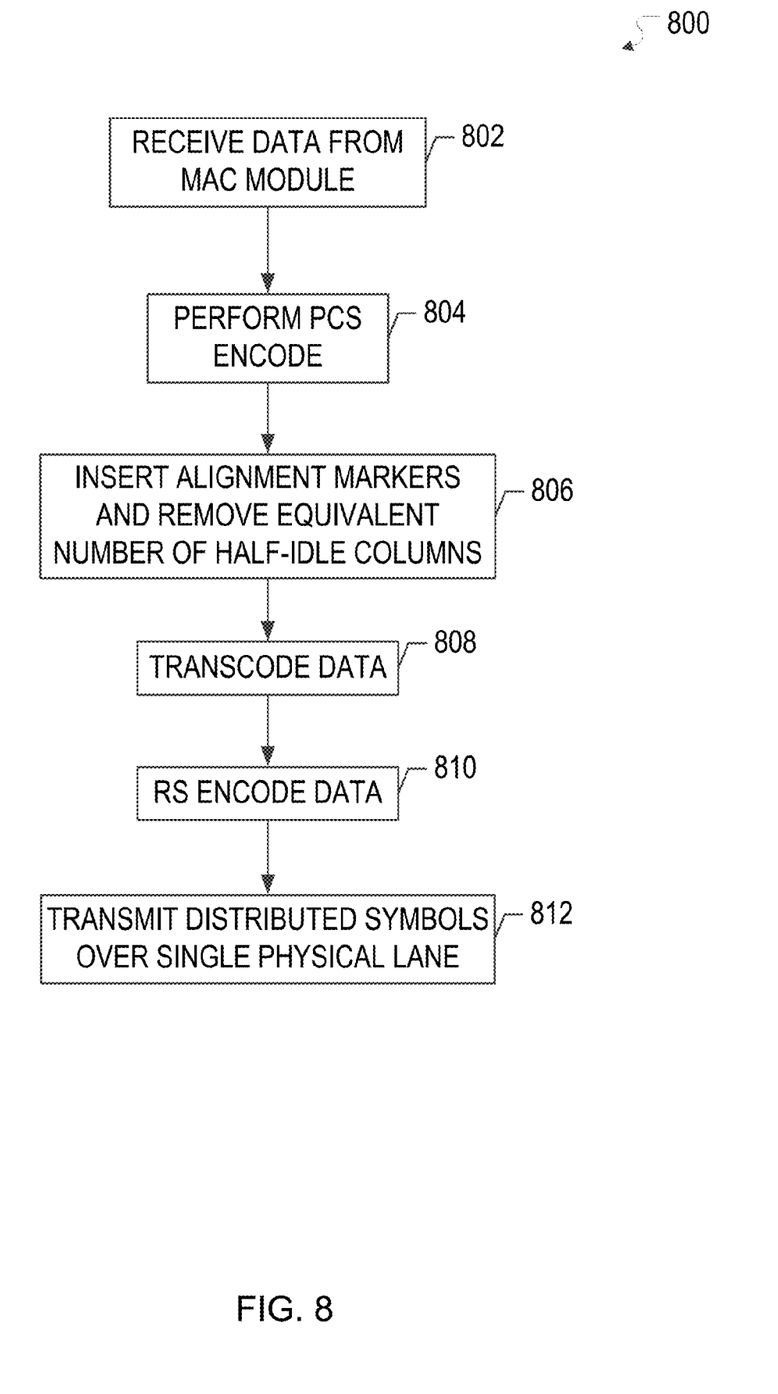
FIG. 8 illustrates a flow diagram of an example process of a transmit portion of a single physical lane 25 G port of an example network device in accordance with one or more implementations.

FIG. 8 illustrates a flow diagram of an example process 800 of a transmit portion of a single physical lane 25 G port of an example network device 110 in accordance with one or more implementations. For explanatory purposes, the example process 800 is primarily described herein with reference to the Tx PCS-FEC 220A of the network device 110 of FIG. 3; however, the example process 800 is not limited to the Tx PCS-FEC 220A of the network device 110 of FIG. 3, e.g. the example process 800 may be performed by one or more of the electronic devices 102, 104, 106, and/or the example process 800 may be performed by one or more of the Tx PCS-FECs 220B-D of the network device 110. Further for explanatory purposes, the blocks of the example process 800 are described herein as occurring in serial, or linearly. However, multiple blocks of the example process 800 may occur in parallel. In addition, the blocks of the example process 800 may be performed a different order than the order shown and/or one or more of the blocks of the example process 800 may not be performed.

The PCS encoder 222A receives a data stream from the MAC module 210A (802). The PCS encoder 222A performs one or more PCS encoding functions on the received data stream, such as 64 b/66 b line encoding (804). The alignment controller 224A inserts the CL82 40 G alignment marker columns, such as AM0, AM1, AM2, AM3, into the data stream every number of blocks, such as every 81,916 blocks, and removes an equivalent number of half-IDLE columns to account for the bandwidth addition of the alignment markers (806).

The transcoder 226A transcodes (e.g. compresses) the data stream such that all four of the alignment markers appear as contiguous data on the transmit wire (808). The transcoder 226A compresses the four alignment markers by removing the sync header (SH) bits, and adding one bit of 1'b1 at the end. Thus, the four 66-bit alignment markers are compressed to four 64-bit datum, plus one extra bit, for a total of 257 bits, which is the IEEE transcoder compression rate requirement.

The RS encoder 228A performs RS FEC encoding on the data stream, such as by adding parity information to the data stream (810). The output of the RS encoder 228A is contiguously transmitted over the single physical lane of the port 240A via the PMD/PMA module 230A (812).

Figure 9:
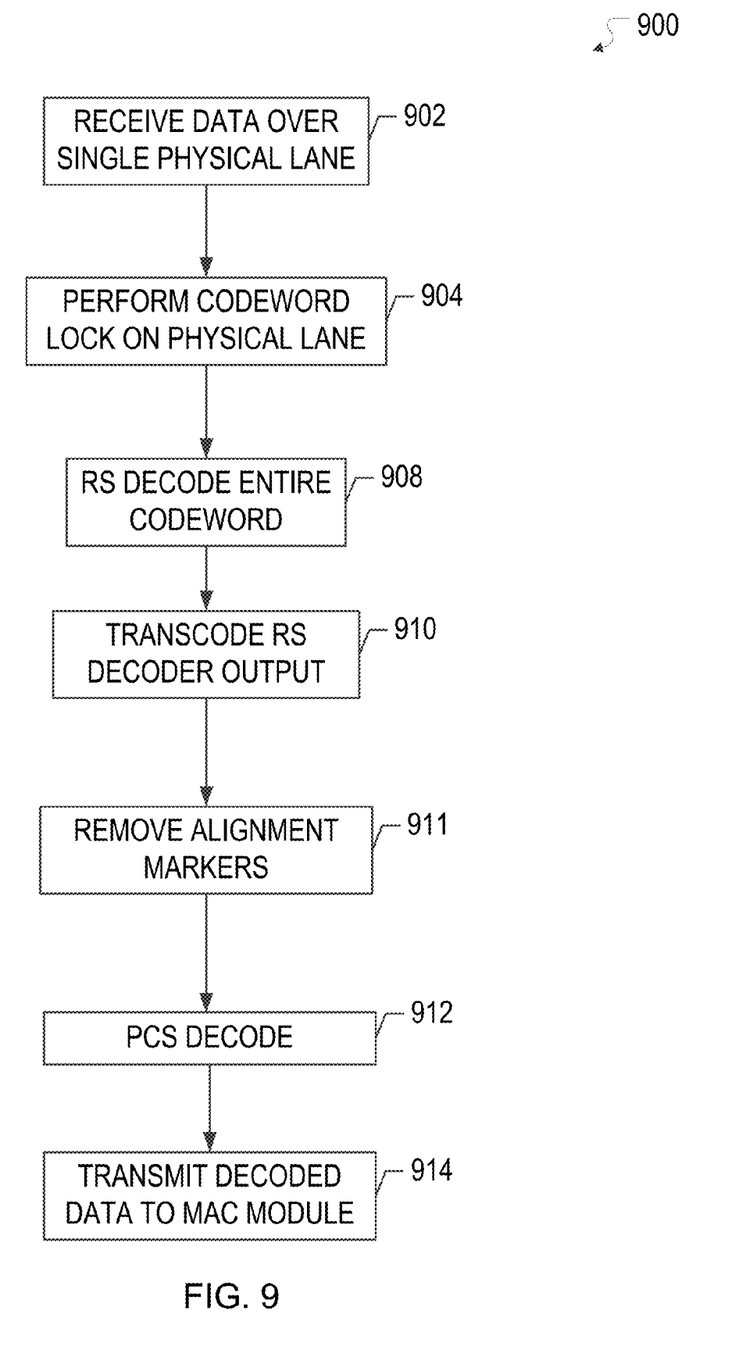
FIG. 9 illustrates a flow diagram of an example process of a receive portion of a single physical lane 25 G port of an example network device in accordance with one or more implementations.

FIG. 9 illustrates a flow diagram of an example process 900 of a receive portion of a single physical lane 25 G port of an example network device 110 in accordance with one or more implementations. For explanatory purposes, the example process 900 is primarily described herein with reference to the network device 110 of FIGS. 1 and 5; however, the example process 900 is not limited to the network device 110 of FIGS. 1 and 5, e.g. the example process 900 may be performed by one or more of the electronic devices 102, 104, 106, and/or the example process 900 may be performed by one or more components of the network device 110. Further for explanatory purposes, the blocks of the example process 900 are described herein as occurring in serial, or linearly. However, multiple blocks of the example process 900 may occur in parallel. In addition, the blocks of the example process 900 may be performed a different order than the order shown and/or one or more of the blocks of the example process 900 may not be performed.

The Rx PCS-FEC components 420A-D each receive data from a single physical lane assigned to the respective ports 440A-D via the PMA/PMD modules 430A-D (902). The codeword lock modules 428A-D perform codeword lock on the data streams received over each respective physical lane (904). The codeword lock modules 428A-D may only track a single alignment marker, e.g. AM0, to determine FEC lane number, since there are no FEC lane numbers. The alignment controller 426 provides one entire codeword to the RS decoder 425 at a time in a TDM fashion, e.g. on a port-by-port basis, and the RS decoder 425 decodes the entire codeword (908). The transcoders 424A-D perform reverse transcoding on the output of the RS decoder 425, e.g. the reverse of the transcoding that was performed by the transcoders 226A-D (910).

The alignment markers are then removed from the data (911). The PCS decoders 422A-D perform one or more PCS decoding functions on the data after the alignment markers are removed, such as line decoding (912). The PCS decoders 422A-D transmit the line decoded data to the MAC modules 210A-D (914).

Figure 10:
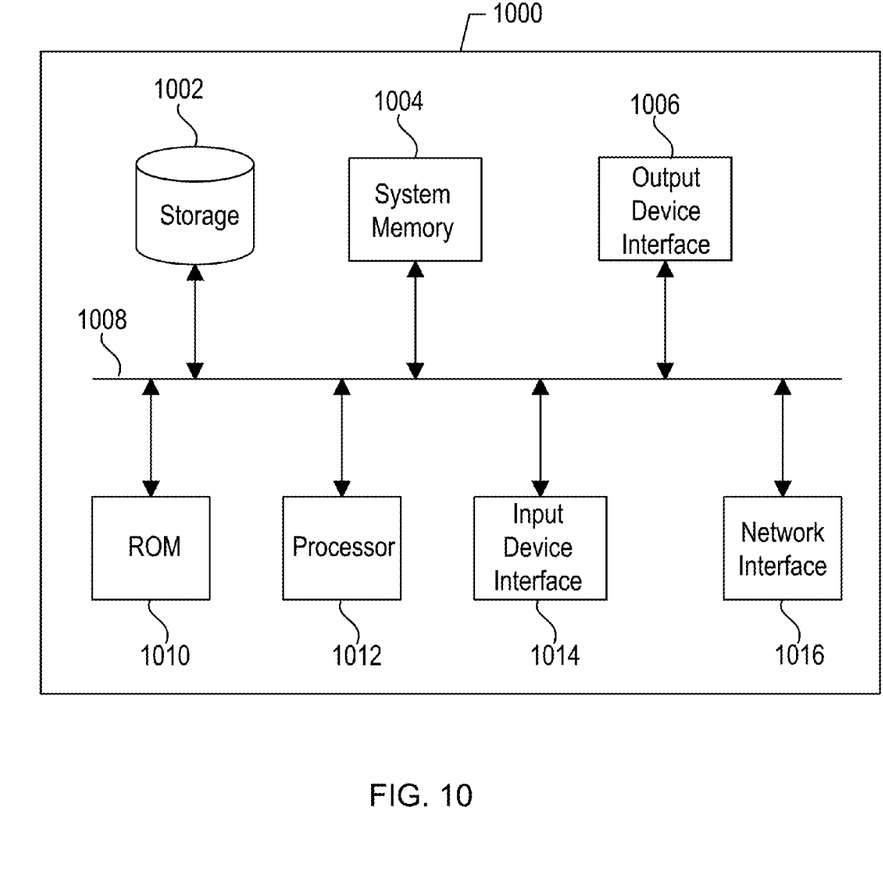
FIG. 10 conceptually illustrates an example electronic system with which one or more implementations of the subject technology can be implemented.

FIG. 10 conceptually illustrates an example electronic system 1000 with which one or more implementations of the subject technology can be implemented. The electronic system 1000, for example, may be, or may include, one or more of the electronic device 102, 104, 106, the network device 110, a routing device, a switch device, a desktop computer, a laptop computer, a tablet device, a phone, and/or generally any electronic device. Such an electronic system 1000 includes various types of computer readable media and interfaces for various other types of computer readable media. The electronic system 1000 includes a bus 1008, one or more processing unit(s) 1012, a system memory 1004, a read-only memory (ROM) 1010, a permanent storage device 1002, an input device interface 1014, an output device interface 1006, one or more network interface(s) 1016, and/or subsets and variations thereof.

The bus 1008 collectively represents all system, peripheral, and chipset buses that communicatively connect the numerous internal devices of the electronic system 1000. In one or more implementations, the bus 1008 communicatively connects the one or more processing unit(s) 1012 with the ROM 1010, the system memory 1004, and the permanent storage device 1002. From these various memory units, the one or more processing unit(s) 1012 retrieves instructions to execute and data to process in order to execute the processes of the subject disclosure. The one or more processing unit(s) 1012 can be a single processor or a multi-core processor in different implementations.

The ROM 1010 stores static data and instructions that are utilized by the one or more processing unit(s) 1012 and other modules of the electronic system 1000. The permanent storage device 1002, on the other hand, may be a read-and-write memory device. The permanent storage device 1002 may be a non-volatile memory unit that stores instructions and data even when the electronic system 1000 is off. In one or more implementations, a mass-storage device (such as a magnetic or optical disk and its corresponding disk drive) may be used as the permanent storage device 1002.

In one or more implementations, a removable storage device (such as a floppy disk, flash drive, and its corresponding disk drive) may be used as the permanent storage device 1002. Like the permanent storage device 1002, the system memory 1004 may be a read-and-write memory device. However, unlike the permanent storage device 1002, the system memory 1004 may be a volatile read-and-write memory, such as random access memory (RAM). The system memory 1004 may store one or more of the instructions and/or data that the one or more processing unit(s) 1012 may utilize at runtime. In one or more implementations, the processes of the subject disclosure are stored in the system memory 1004, the permanent storage device 1002, and/or the ROM 1010. From these various memory units, the one or more processing unit(s) 1012 retrieve instructions to execute and data to process in order to execute the processes of one or more implementations.

The bus 1008 also connects to the input and output device interfaces 1014 and 1006. The input device interface 1014 enables a user to communicate information and select commands to the electronic system 1000. Input devices that may be used with the input device interface 1014 may include, for example, alphanumeric keyboards and pointing devices (also called "cursor control devices"). The output device interface 1006 may enable, for example, the display of images generated by the electronic system 1000. Output devices that may be used with the output device interface 1006 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

As shown in FIG. 10, bus 1008 also couples electronic system 1000 to one or more networks (not shown) through one or more network interface(s) 1016. The one or more network interface(s) may include an optical interface, an Ethernet interface, a wireless interface, a multimedia over coax alliance (MoCA) interface, a reduced gigabit media independent interface (RGMII), or generally any interface for connecting to a network. In this manner, electronic system 1000 can be a part of one or more networks of computers (such as a local area network (LAN), a wide area network (WAN), or an Intranet, or a network of networks, such as the Internet. Any or all components of electronic system 1000 can be used in conjunction with the subject disclosure.

Implementations within the scope of the present disclosure can be partially or entirely realized using a tangible computer-readable storage medium (or multiple tangible computer-readable storage media of one or more types)

encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (e.g., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device comprising:
   at least one processor circuit configured to:
   perform line encoding on a data stream received from a media access control (MAC) module;
   periodically insert a plurality of alignment markers after every number of blocks of the data stream;
   transcode the data stream, wherein each alignment marker of the plurality of alignment markers remains contiguous in the transcoded data stream;
   add parity information to the transcoded data stream; and
   transmit the transcoded data stream over no more than two physical lanes of an associated port.

2. The device of claim 1, wherein at the at least one processor circuit is further configured to:
   distribute symbols of the transcoded data stream to the no more than two physical lanes of the associated port; and
   transmit the distributed symbols over the no more than two physical lanes of the associated port, wherein each alignment marker of the plurality of alignment markers remains contiguous over one of the no more than two physical lanes.

3. The device of claim 2, wherein the plurality of alignment markers are inserted every 81,916 blocks.

4. The device of claim 3, wherein the blocks comprise 66-bit blocks.

5. The device of claim 3, wherein the plurality of alignment markers are respectively designated as AM0, AM1, AM2, and AM3.

6. The device of claim 2, wherein the plurality of alignment markers comprises a first number of alignment markers when a data rate is a first data rate or a second data rate that is different than the first data rate.

7. The device of claim 6, wherein the plurality of alignment markers comprises a second number of alignment markers when the data rate is a third data rate that is greater than the first and second data rates.

8. The device of claim 1, wherein the line encoding comprises a 64 b/66 b line encoding.

9. The device of claim 1, wherein the no more than two physical lanes of the associated port comprises a single physical lane of the associated port.

10. A computer program product comprising instructions stored in a non-transitory computer-readable storage medium, the instructions comprising:
    instructions to periodically insert a plurality of alignment markers after every number of blocks of a line encoded data stream;
    instructions to transcode the line encoded data stream;
    instructions to perform forward error correction (FEC) encoding on the transcoded data stream; and
    instructions to transmit the FEC encoded data stream over no more than two physical lanes of an associated port.

11. The computer program product of claim 10, wherein the plurality of alignment markers are respectively designated as AM0, AM1, AM2, and AM3, and the plurality of alignment markers are inserted after every 81,916 blocks.

12. The computer program product of claim 10, wherein each alignment marker of the plurality of alignment markers remains contiguous in the FEC encoded data stream.

13. The computer program product of claim 10, the instructions further comprising:
    instructions to distribute symbols of the FEC encoded data stream to the no more than two physical lanes of the associated port; and
    instructions to transmit the distributed symbols of the FEC encoded data stream over the no more than two physical lanes of the associated port, wherein each alignment marker of the plurality of alignment markers remains contiguous over one of the no more than two physical lanes.

14. A method comprising:
    performing line encoding on a data stream received from a media access control (MAC) module;
    periodically inserting a plurality of alignment markers after every number of blocks of the data stream;
    transcoding the data stream, wherein each alignment marker of the plurality of alignment markers remains contiguous in the transcoded data stream;
    adding parity information to the transcoded data stream;
    distributing symbols of the transcoded data stream to no more than two physical lanes of an associated port; and
    transmitting the symbols of the transcoded data stream over the no more than two physical lane of the associated port.

15. The method of claim 14, wherein each alignment marker of the plurality of alignment markers remains contiguous over at least one of the no more than two physical lanes.

16. The method of claim 15, wherein the plurality of alignment markers are inserted every 81,916 blocks.

17. The method of claim 16, wherein the blocks comprise 66-bit blocks.

18. The method of claim 16, wherein the plurality of alignment markers comprise AM0, AM1, AM2, and AM3.

19. The method of claim 15, wherein the plurality of alignment markers comprises a first number of alignment markers when a data rate is a first data rate or a second data rate that is different than the first data rate.

20. The method of claim 19, wherein the plurality of alignment markers comprises a second number of alignment markers when the data rate is a third data rate that is greater than the first and second data rates.

* * * * *